(12) United States Patent
Shen et al.

(10) Patent No.: US 10,178,363 B2
(45) Date of Patent: Jan. 8, 2019

(54) HD COLOR IMAGING USING MONOCHROMATIC CMOS IMAGE SENSORS INTEGRATED IN 3D PACKAGE

(71) Applicant: Invensas Corporation, San Jose, CA (US)

(72) Inventors: Hong Shen, Palo Alto, CA (US); Liang Wang, Milpitas, CA (US); Guilian Gao, San Jose, CA (US); Arkalgud R. Sitaram, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 119 days.

(21) Appl. No.: 15/280,661

(22) Filed: Sep. 29, 2016

(65) Prior Publication Data
US 2017/0099474 A1 Apr. 6, 2017

Related U.S. Application Data

(60) Provisional application No. 62/236,693, filed on Oct. 2, 2015.

(51) Int. Cl.
*H04N 9/04* (2006.01)
*H04N 9/43* (2006.01)
(Continued)

(52) U.S. Cl.
CPC .......... *H04N 9/43* (2013.01); *G02B 27/1013* (2013.01); *G06T 1/20* (2013.01); *H01L 27/1462* (2013.01);
(Continued)

(58) Field of Classification Search
CPC ...................................................... H04N 9/43
See application file for complete search history.

(56) References Cited

U.S. PATENT DOCUMENTS 6,788,338 B1 * 9/2004 Dinev ................. H04N 5/2258
  348/222.1
7,335,870 B1 * 2/2008 Yang ................ H01L 27/14618
  250/208.1

(Continued)

OTHER PUBLICATIONS

International Search Report and Written Opinion for PCT/US2016/054857, dated Jan. 16, 2017.

*Primary Examiner* — Jayanti K Patel
*Assistant Examiner* — Irfan Habib

(57) ABSTRACT

HD color video using monochromatic CMOS image sensors integrated in a 3D package is provided. An example 3DIC package for color video includes a beam splitter to partition received light of an image stream into multiple light outputs. Multiple monochromatic CMOS image sensors are each coupled to one of the multiple light outputs to sense a monochromatic image stream at a respective component wavelength of the received light. Each monochromatic CMOS image sensor is specially constructed, doped, controlled, and tuned to its respective wavelength of light. A parallel processing integrator or interposer chip heterogeneously combines the respective monochromatic image streams into a full-spectrum color video stream, including parallel processing of an infrared or ultraviolet stream. The parallel processing of the monochromatic image streams provides reconstruction to HD or 4K HD color video at low light levels. Parallel processing to one interposer chip also enhances speed, spatial resolution, sensitivity, low light performance, and color reconstruction.

19 Claims, 6 Drawing Sheets

(51) Int. Cl.

| | | |
|---|---|---|
| *G02B 27/10* | (2006.01) | |
| *G06T 1/20* | (2006.01) | |
| *H01L 27/146* | (2006.01) | |
| *H01L 31/0232* | (2014.01) | |
| *H01L 31/028* | (2006.01) | |
| *H01L 31/0296* | (2006.01) | |
| *H01L 31/0304* | (2006.01) | |
| *H01L 31/032* | (2006.01) | |
| *H04N 5/33* | (2006.01) | |
| *H04N 5/374* | (2011.01) | |
| *H04N 9/097* | (2006.01) | |
| *H04N 9/76* | (2006.01) | |

(52) U.S. Cl.
CPC ...... *H01L 27/1465* (2013.01); *H01L 27/1469* (2013.01); *H01L 27/14634* (2013.01); *H01L 27/14645* (2013.01); *H01L 27/14685* (2013.01); *H01L 31/028* (2013.01); *H01L 31/0296* (2013.01); *H01L 31/02322* (2013.01); *H01L 31/032* (2013.01); *H01L 31/0304* (2013.01); *H04N 5/332* (2013.01); *H04N 5/374* (2013.01); *H04N 9/045* (2013.01); *H04N 9/097* (2013.01); *H04N 9/76* (2013.01)

(56) References Cited

U.S. PATENT DOCUMENTS

| | | | | |
|---|---|---|---|---|
| 7,973,413 B2* | 7/2011 | Kuo | ............... | H01L 21/76898 257/706 |
| 8,009,200 B2* | 8/2011 | Goh | ............... | H04N 13/10 348/218.1 |
| 8,368,784 B2* | 2/2013 | Yamaguchi | ... | H01L 27/14632 348/272 |
| 8,426,961 B2* | 4/2013 | Shih | ............... | H01L 21/486 257/698 |
| 8,531,565 B2* | 9/2013 | Wang | ............... | H01L 27/1463 348/241 |
| 8,541,820 B2* | 9/2013 | Hayasaki | ... | H01L 21/76898 257/184 |
| 8,669,174 B2* | 3/2014 | Wu | ............... | H01L 21/6835 438/108 |
| 8,773,562 B1* | 7/2014 | Fan | ............... | H01L 27/14643 348/308 |
| 8,802,504 B1* | 8/2014 | Hou | ............... | H01L 23/49811 438/108 |
| 8,957,358 B2* | 2/2015 | Wan | ............... | H01L 27/14609 250/208.1 |
| 9,142,586 B2* | 9/2015 | Wang | ............... | H01L 27/14621 |
| 9,153,565 B2* | 10/2015 | Chen | ............... | H01L 27/14634 |
| 9,161,017 B2* | 10/2015 | Hiramoto | ... | G03B 35/04 |
| 9,287,310 B2* | 3/2016 | Chen | ............... | H01L 27/14632 |
| 9,287,312 B2* | 3/2016 | Kao | ............... | H01L 27/14641 |
| 9,478,579 B2* | 10/2016 | Dai | ............... | H01L 27/14609 |
| 9,691,733 B1* | 6/2017 | Shen | ............... | H01L 24/83 |
| 9,706,132 B2* | 7/2017 | Nisenzon | ... | H04N 9/735 |
| 9,712,759 B2* | 7/2017 | Venkataraman | ... | H01L 27/14618 |
| 9,754,422 B2* | 9/2017 | McMahon | ... | G06T 19/20 |
| 9,774,789 B2* | 9/2017 | Ciurea | ... | H04N 5/2258 |
| 9,774,797 B2* | 9/2017 | Richards | ... | H04N 5/33 |
| 9,807,322 B2* | 10/2017 | Feder | ... | H04N 5/35554 |
| 9,887,243 B2* | 2/2018 | Yamaguchi | ... | H01L 27/14632 |
| 9,888,194 B2* | 2/2018 | Duparre | ... | B82Y 30/00 |
| 9,898,856 B2* | 2/2018 | Yang | ... | G06T 5/006 |
| 9,912,928 B2* | 3/2018 | Rivard | ... | H04N 5/247 |
| 9,917,998 B2* | 3/2018 | Venkataraman | ... | H04N 5/2258 |
| 9,918,017 B2* | 3/2018 | Rivard | ... | H04N 5/2355 |
| 10,050,018 B2* | 8/2018 | Wu | ... | H01L 25/0657 |
| 2011/0095418 A1* | 4/2011 | Lim | ... | H01L 23/3128 257/737 |
| 2011/0116078 A1 | 5/2011 | Cho et al. | | |
| 2013/0063918 A1* | 3/2013 | Haba | ... | H01L 23/49827 361/772 |
| 2013/0284885 A1* | 10/2013 | Chen | ... | H01L 25/16 250/208.1 |
| 2014/0001645 A1* | 1/2014 | Lin | ... | H01L 23/49816 257/774 |
| 2014/0049660 A1* | 2/2014 | Olsen | ... | H04N 5/3415 348/218.1 |
| 2014/0163319 A1 | 6/2014 | Blanquart et al. | | |
| 2014/0179034 A1* | 6/2014 | Barwicz | ... | F21V 21/00 438/26 |
| 2014/0225258 A1* | 8/2014 | Chiu | ... | H01L 23/49816 257/738 |
| 2015/0062368 A1 | 3/2015 | Li | | |
| 2015/0279816 A1* | 10/2015 | Chen | ... | H01L 25/0657 257/774 |
| 2015/0348872 A1* | 12/2015 | Kuo | ... | H01L 23/522 257/774 |

* cited by examiner

HD COLOR IMAGING USING MONOCHROMATIC CMOS IMAGE SENSORS INTEGRATED IN 3D PACKAGE

RELATED APPLICATIONS

This patent application claims the benefit of priority to U.S. Provisional Patent Application No. 62/236,693 to Shen et al., entitled, "HD Color Video Using Monochromatic CMOS Image Sensors Integrated In 3D Package," filed Oct. 2, 2015 and incorporated herein by reference in its entirety.

BACKGROUND

Conventional image sensor packages leave much room for improvement at the wafer level. For example, conventional backside illuminated (BSI) CMOS image sensor packages waste pixels by design. There is also an undesirable leakage current between color pixels. The conventional designs impose limitations on color reproduction, image detail, and speed/form factor. These limitations are variously caused by differences in the way that different wavelengths of light (different colors) interact with conventional monolithic filters and uniform image sensor materials. Blue wavelengths penetrate in a relatively shallow manner while red wavelengths penetrate much deeper.

As shown in FIG. 1, a conventional unbalanced Bayer filter mosaic array 50 is a color filter array (CFA) for arranging red-green-blue (RGB) color filters on a square grid of photosensors. The filter pattern is 50% green, 25% red and 25% blue, providing a RGGB filter 60. The conventional unbalanced Bayer filter mosaic array 50 has twice as many green filters as blue or red, which decreases accurate color reproduction of individual pixels. Due to the transmission spectral profiles 70 of the dyes commonly used in Bayer filters, the quantum efficiency of the red filters is significantly greater than that of the green and blue filters, which are close to each other in overall efficiency. After an image stream passes through the conventional Bayer filter 50, the materials of the conventional sensing surface are monolithic, so the thickness and doping profile of the sensor materials cannot be optimized for each color. Compensating for these conventional drawbacks results in additional complexity in conventional CMOS BSI designs for image sensor packages. Moreover, state-of-the-art high-definition (HD) video of 16M or greater calls for an approximately 1.0 nanosecond sensing and processing time.

In the conventional designs 50, three of the four pixels (the RGG pixels of a RGGB group of pixels) pass yellow light (at wavelength 585 nm) plus 20% blue light (435 nm). A blue pixel (B) passes nothing but blue light (435 nm). This imbalance causes a reduction in spatial resolution and sensitivity. Conventional designs compare the color (chromaticity) and intensity (luminosity) of a given pixel with neighboring pixels to reconstruct the signal to R, B, G, using various linear, next-neighbor, cubic, cubic spiral, cubic spline, and sinc interpolator patterns. For edge pixels with no neighboring pixels, the reconstruction is wasted. Other inherent problems with conventional designs include noise and crosstalk, with on-chip suppression and active decoupling executed at the sacrifice of speed.

SUMMARY

HD color video using monochromatic CMOS image sensors integrated in a 3D package is provided. An example 3DIC package for color video includes a beam splitter to partition received light of an image stream into multiple light outputs. Multiple monochromatic CMOS image sensors are each coupled to one of the multiple light outputs to sense a monochromatic image stream at a respective component wavelength of the received light. Each monochromatic CMOS image sensor is specially constructed, doped, controlled, and tuned to its respective wavelength of light. A parallel processing integrator or interposer chip heterogeneously combines the respective monochromatic image streams into a full-spectrum color video stream, including parallel processing of an infrared or ultraviolet stream. The parallel processing of the monochromatic image streams provides reconstruction to HD or 4K HD color video at low light levels. Parallel processing to one interposer chip also enhances speed, spatial resolution, sensitivity, low light performance, and color reconstruction.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes example high-definition (HD) color video using monochromatic CMOS image sensors integrated in a 3D package.

Figure 1:
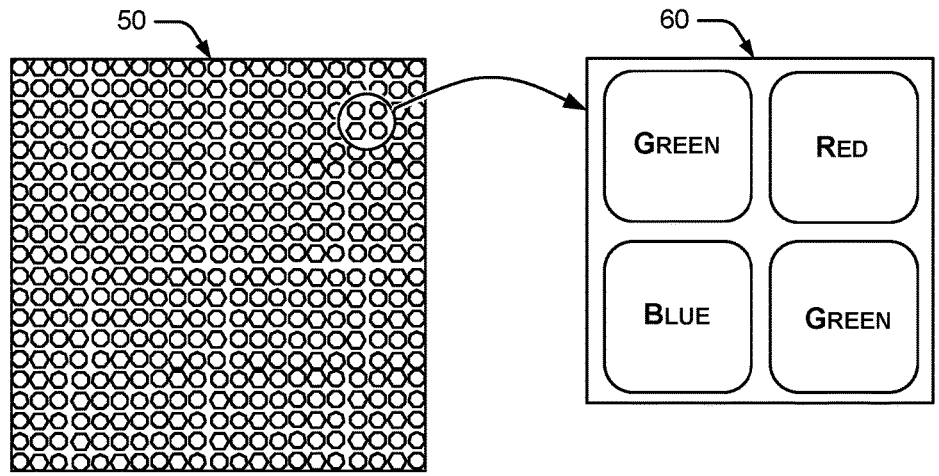
FIG. 1 is a diagram of prior art Bayer pattern filter mosaic limitations.
Figure 1:
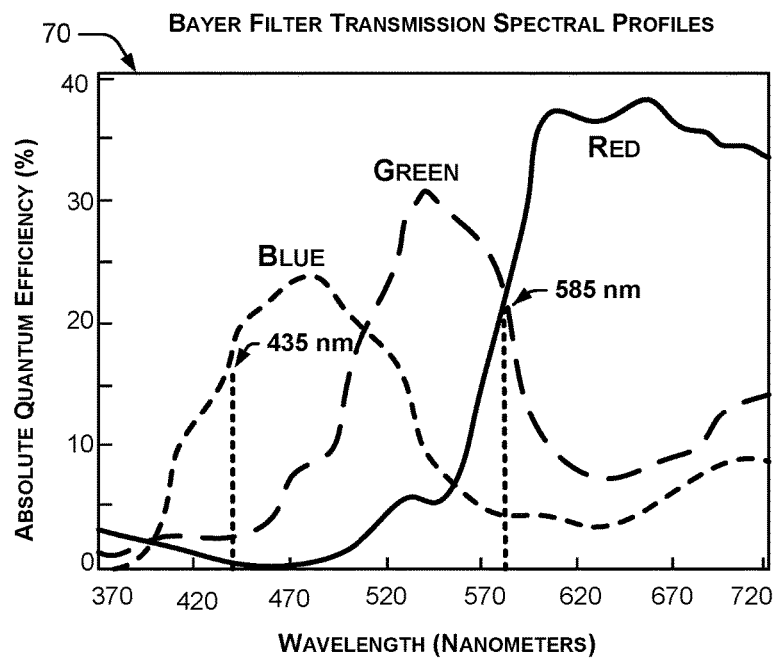
Figure 2:
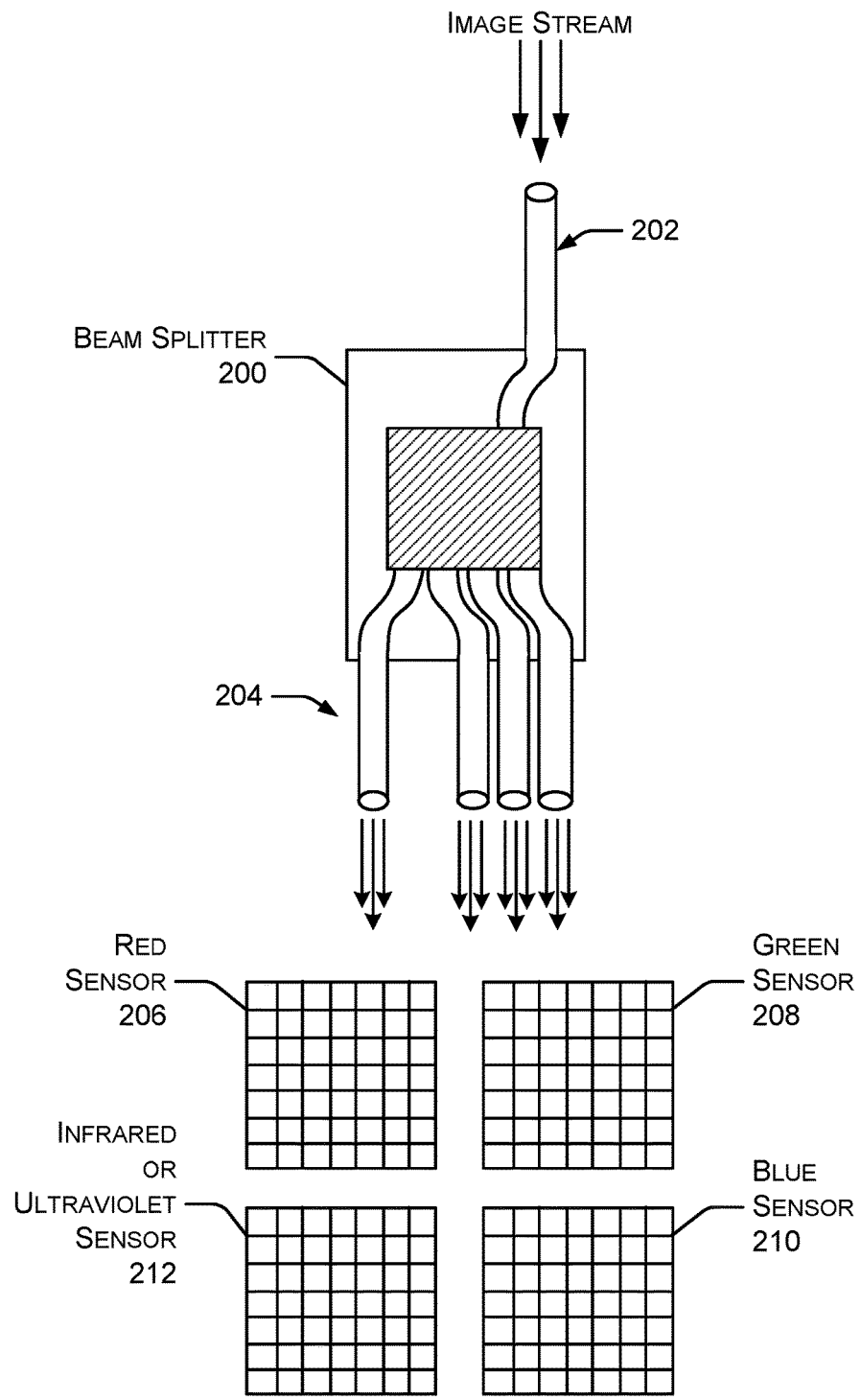
FIG. 2 is a diagram of an example system for splitting an image stream into multiple instances for image sensors each dedicated to one color or wavelength range.

FIG. 2 shows an example system for capturing and splitting an image stream into multiple instances of the same video stream for image sensors each dedicated to one color or wavelength range. In an implementation, an example 3DIC package for generating full-spectrum HD color video includes an optical "beam" splitter 200 to partition received light of an image stream into multiple light outputs. The beam splitter 200 may have a single optical input 202 which branches to multiple optical outputs 204 conveying the same image stream as the input 202 receives. Alternatives, such as prisms, may be used in place of a fiber optic or tree coupler beam splitter 200. Thus, the optical splitter 200 can be a tree coupler, prism, fiber optic coupler, or other optical beam splitter. Multiple monochromatic CMOS image sensors, such as a red sensor 206, a green sensor 208, a blue sensor 210, and an infrared or ultraviolet sensor 212, are each coupled to one of the multiple light outputs to monochromatically sense the corresponding image stream at a respective component wavelength of the received light. An integrator or interposer chip heterogeneously combines the respective monochromatic image streams into a full-spectrum color video stream. The different monochromatic image streams are processed in parallel to reconstruct the full-spectrum video stream, including optional parallel processing of the infrared or the ultraviolet stream. Parallel processing of monochromatic image streams improves quantum efficiency and can provide reconstruction to HD or 4K HD color video at very low light levels. Parallel processing to one interposer chip also enhances speed, spatial resolution, sensitivity, low light performance, and color reconstruction.

The acronym CMOS means "complementary-metal-oxide-semiconductor." "Monochromatic" as used herein means a single color or single wavelength of light, or a range of adjacent wavelengths approximating a single color, such as red or a range of reds, as sensed by humans or defined scientifically to define a definite range or a limited series of adjacent electromagnetic radiation wavelengths.

Depletion Region Width Considerations for Different Wavelengths

In an implementation, an example 3DIC package for color video includes the multiple monochromatic CMOS image sensors 206 & 208 & 210 & 212, each coupled to a light output 204 of a beam splitter 200 to sense a monochromatic image stream from the full-spectrum image stream at a respective component wavelength of the received light. In an implementation, for sensing a particular wavelength of light, given a semiconductor material with a respective dielectric constant, the depletion layer width W can be determined by Equations (1)-(4):

$$W = x_p + x_n = \sqrt{\frac{2\varepsilon}{q} V_o \left( \frac{1}{N_A} + \frac{1}{N_D} \right)} \quad (1)$$

$$x_p = W \frac{N_D}{N_A + N_D} \quad (2)$$

$$x_n = W \frac{N_A}{N_A + N_D} \quad (3)$$

$$V_o = \frac{kT}{q} \ln\left(\frac{N_A N_D}{n_i^2}\right) \quad (4)$$

where $N_A/N_D$ is the carrier concentration, $V_o$ is the potential across the junction, that is, the built-in voltage that is calculated separately, $x_p$ is the penetration of the space charge region into the p-side, and $x_n$ is the penetration into the n-side. The total width W of the depletion region is the sum of $x_p$ and $x_n$. Hence, a lightly doped semiconductor is one in which the depletion width is large and a heavily doped semiconductor is one in which the depletion width is small.

The desired depletion width (for a given wavelength) can be achieved by selecting the voltage potential and the appropriate dopant for each individual monochromatic CMOS image sensor. Monochromatic, as used herein and introduced above, means a particular wavelength or a limited range of wavelengths characteristic of, or comprising, a component of the electromagnetic radiation spectrum, for example a range of wavelengths approximating the color red or approximating a range or a series of red colors.

Materials for optimally sensing the wavelengths for blue, green, and red need different depletion regions to increase quantum efficiency. Blue, for example, is in the 0.1 micrometer range. Red, on the other hand, is in the 1.0-5.0 micrometer range (unlikely to deplete that deep). In an implementation, each of the multiple monochromatic CMOS image sensors 206 & 208 & 210 & 212 has a different voltage potential and different doping for the respective color (wavelength or wavelength range) to be sensed. Moreover, each monochromatic CMOS image sensor 206 & 208 & 210 & 212 can have a different thickness suited to sensing the respective color (wavelength) and a respective antireflection layer also suited to sensing the respective color (wavelength). These customizations for each wavelength to be sensed are not possible in conventional image sensor designs.

Example Systems

Figure 3:
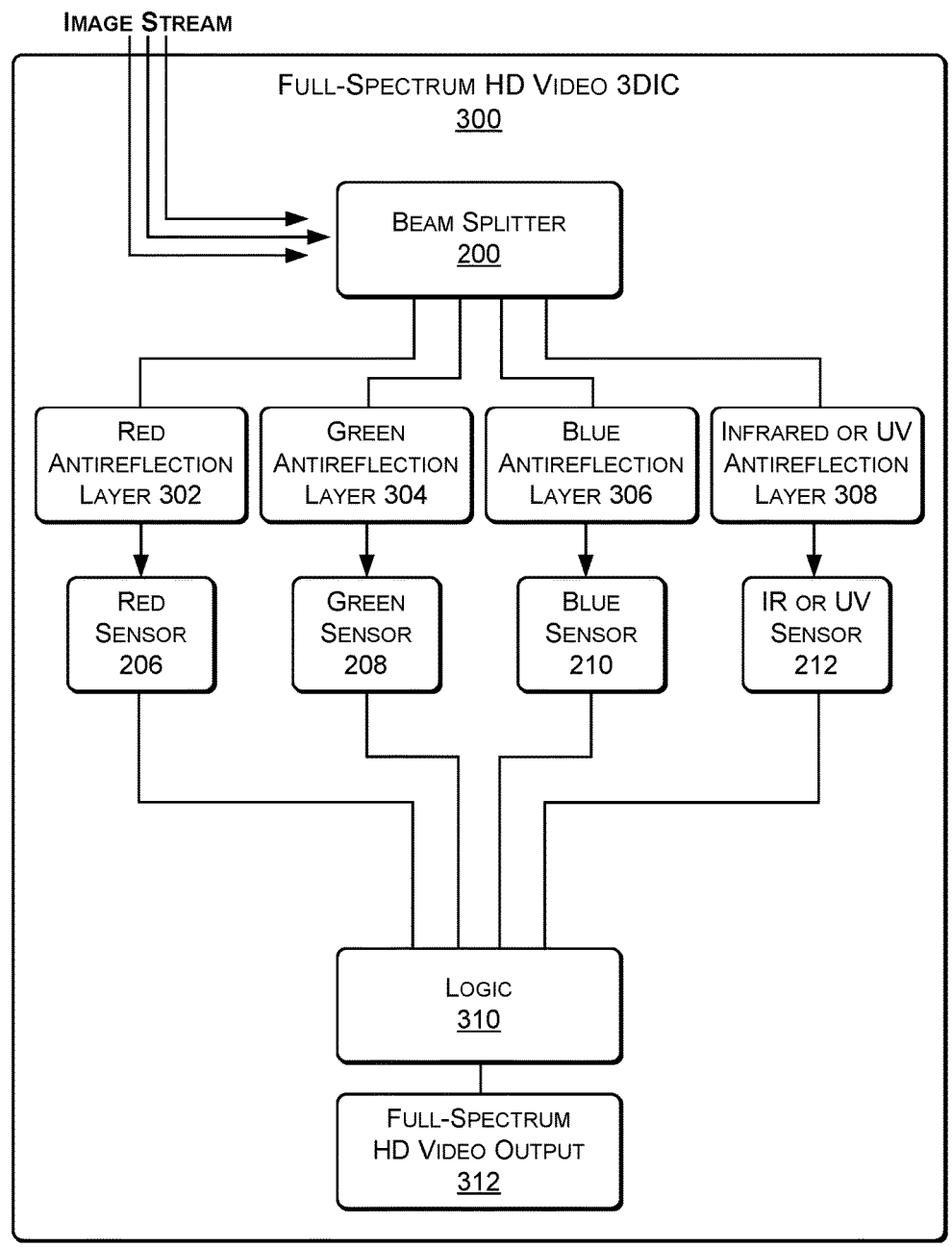
FIG. 3 is a block diagram of an example 3-dimensional (3D) integrated circuit (IC) package for full-spectrum HD video.

FIG. 3 shows an example 3DIC image sensor package 300 that uses four separate monochromatic CMOS sensors, for example, one sensor each for red 206, green 208, blue 210, and infrared 212. An ultraviolet sensor (or another wavelength range) may also be substituted for the infrared sensor 212. The infrared monochromatic CMOS sensor 212 may be composed of InGaAs or similar materials. Integrating a material to sense infrared 212 is not easily performed with conventional CMOS image sensor designs, but can enhance performance because of the extra visual information available in infrared, and the capability of night vision provided by infrared.

The example 3DIC image sensor package 300 of FIG. 3 can provide full-spectrum HD video. The example 3DIC image sensor package 300 includes a beam splitter 200, but the beam splitter 200 or a comparable alternative can also reside separately from the 3DIC 300 in some implementations. The 3DIC package 300 may include multiple antireflection layers, each situated and tuned to the color of light or the light wavelength that corresponds to the sensing capability of a respective monochromatic CMOS image sensor. Thus, a red antireflection layer 302 can be associated with the red sensor 206, a green antireflection layer 304 can be associated with the green sensor 208, a blue antireflection layer 306 can be associated with the blue sensor 210, and an infrared or ultraviolet antireflection layer 308 can be associated with the infrared or ultraviolet sensor 212.

Each monochromatic CMOS image sensor 206 & 208 & 210 & 212 is separately coupled to the logic component 310, which can integrate the sensed monochromatic image streams into an integrated full-spectrum (full color) image stream through parallel processing. The full-spectrum image stream can be sent to an HD video output 312.

Figure 4:
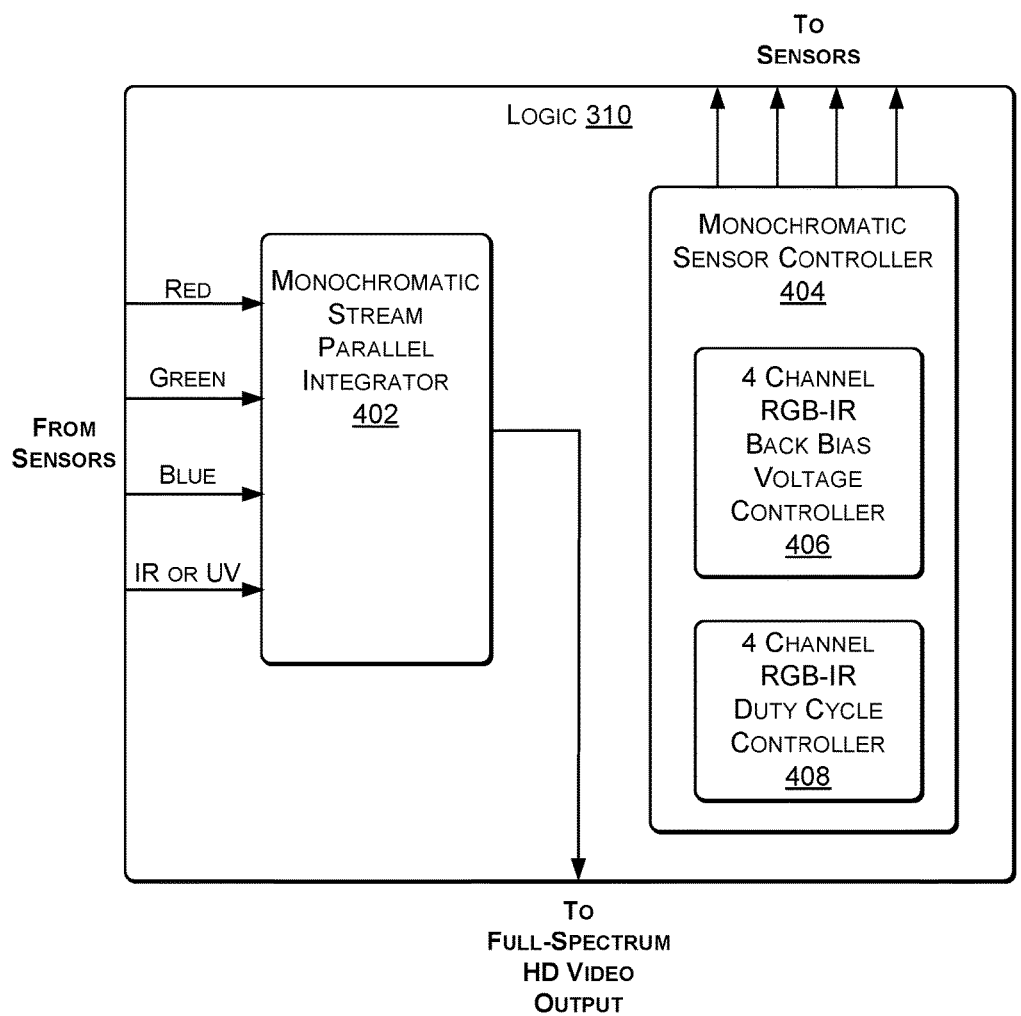
FIG. 4 is a block diagram an example logic component of the example 3DIC of FIG. 3, including a parallel integrator to combine monochromatic image streams.

FIG. 4 shows the example logic component 310 of FIG. 3 in greater detail. In an example implementation, the logic component 310 includes a monochromatic stream parallel integrator 402, and a monochromatic sensor controller 404. The monochromatic sensor controller 404 can further include a back bias voltage controller, such as a 4-channel controller 406 for individually controlling the back bias voltage of each of the red sensor 206, the green sensor 208, the blue sensor 210, and the infrared or ultraviolet sensor 212. The monochromatic sensor controller 404 may also further include a duty cycle controller, such as a 4-channel controller 408 for individually controlling the duty cycles of each of each of the red sensor 206, the green sensor 208, the blue sensor 210, and the infrared or ultraviolet sensor 212.

In an implementation, the 3DIC package 300, including the logic component 310, has multiple chips sensing and processing in parallel, providing a multifold improvement in speed, especially for HD video, over conventional designs. Each antireflection layer 302 & 304 & 306 & 308 is also less expensive than conventional layers, and more effective at targeting specific wavelength ranges, instead of the conventional broadband approach, which requires more antireflection layers.

The example 3DIC image sensor package 300 can be constructed with standardized CMOS fabrication techniques. Non-active or deactivated photodiodes can be mapped out. The different monochromatic image streams generated by the sensors can be heterogeneously integrated onto one parallel integrator 402, such as an interposer chip, to provide faster speeds.

Example Sensor Materials

Integration of III-V semiconductor materials, for example to a CMOS image sensor wafer for sensing infrared 212, presents some challenges, but can provide higher sensitivity, higher spatial resolution, and accurate color reconstruction at low light levels or night vision light levels. The III-V semiconductor materials are more sensitive to infrared wavelengths than to visible wavelengths. The III-V wafer sizes to be used can be small (but up to 150 mm). In the example system, however, it is advantageous to integrate III-V dies onto CMOS image sensor (CIS) wafers via chip-to-wafer bonding, for infrared imaging in parallel with visible imaging. Table (1) below shows example materials for sensing infrared in the example system:

TABLE (1)

| Material | Type | Spectral range (μm) | Wavenumber (cm$^{-1}$) |
|---|---|---|---|
| Indium gallium arsenide (InGaAs) | photodiode | 0.7-2.6 | 14300-3800 |
| Germanium | photodiode | 0.8-1.7 | 12500-5900 |
| Lead sulfide (PbS) | photoconductive | 1-3.2 | 10000-3200 |
| Lead selenide (PbSe) | photoconductive | 1.5-5.2 | 6700-1900 |
| Indium antimonide (InSb) | photoconductive | 1-6.7 | 10000-1500 |
| Indium arsenide (InAs) | photovoltaic | 1-3.8 | 10000-2600 |
| Platinum silicide (PtSi) | photovoltaic | 1-5 | 10000-2000 |
| Indium antimonide (InSb) | photodiode | 1-5.5 | 10000-1800 |
| Mercury cadmium telluride (MCT, HgCdTe) | photoconductive | 0.8-25 | 12500-400 |
| Mercury zinc telluride (MZT, HgZnTe) | photoconductive | | |
| Lithium tantalate (LiTaO$_3$) | pyroelectric | | |
| Triglycine sulfate (TGS and DTGS) | pyroelectric | | |
| Vanadium pentoxide | | | |

Each of the multiple monochromatic CMOS image sensors 206 & 208 & 210 & 212 may have a different thickness and a different doping profile tuned to optimize photodetection of the particular respective monochromatic component wavelength of the received light at a high resolution, even at low light levels or at night vision light levels.

The example integrator, interposer, or other logic electronics 310 can be configured to apply a different back bias voltage 406 to each of the multiple monochromatic CMOS image sensors 206 & 208 & 210 & 212 to control or optimize a depletion width of each individual monochromatic CMOS image sensor 206 & 208 & 210 & 212.

The example integrator, interposer, or other logic electronics 310 can also be configured to apply a different duty cycle 408 to each of the multiple monochromatic CMOS image sensors 206 & 208 & 210 & 212 to tune each of the multiple monochromatic CMOS image sensors 206 & 208 & 210 & 212 for improved performance, such as a tuned sensitivity to a particular component wavelength of the received light and/or an improved quantum efficiency at the particular component wavelength of the received light.

At least one of the multiple monochromatic CMOS image sensors 206 & 208 & 210 & 212 can be composed of a material other than a silicon photodiode material. For example, the material other than a silicon photodiode material can be indium gallium arsenide (InGaAs), germanium (Ge), lead sulfide (PbS), lead selenide (PbSe), photoconductive indium antimonide (InSb), indium arsenide (InAs), Platinum slilcide (PtSi), photodiode-type indium antimonide (InSb), mercury cadmium telluride (MCT, HgCdTe), mercury zinc telluride (MZT, HgZnTe), lithium tantalite (LiTaO3), or triglycine sulfate (TGS and DTGS).

The example 3DIC package 300 can include an up-conversion material for detecting infrared photons, and/or a down-conversion material for detecting ultraviolet photons.

In an implementation, the example 3DIC package 300 may include at least one of the multiple monochromatic CMOS image sensors 206 & 208 & 210 & 212 further utilizing a quantum dot photodetector (QDP) tuned to a component wavelength of the received light or other quantum dot photosensing material.

In various implementations, the multiple monochromatic CMOS image sensors 206 & 208 & 210 & 212 may also integrate their monochromatic output with a full-spectrum sensor, a RGB sensor, a white sensor, a black & white infrared sensor, an ultraviolet sensor, a high frequency microwave sensor, and so forth.

Example Methods

Figure 5:
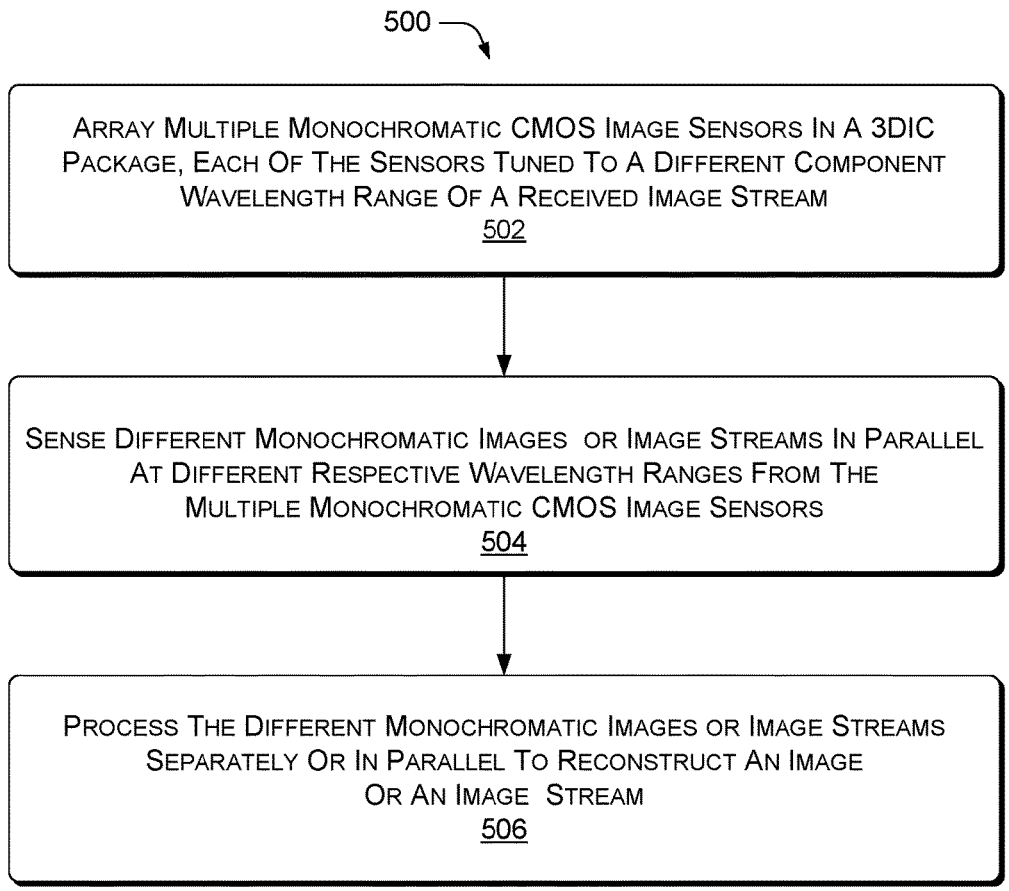
FIG. 5 is a flow diagram of an example method of utilizing multiple monochromatic CMOS image sensors in parallel to reconstruct an HD color video stream.

FIG. 5 shows an example method 500 of utilizing multiple monochromatic CMOS image sensors in parallel to reconstruct an HD color video stream. In the flow diagram, the operations are shown as individual blocks.

At block 502, multiple monochromatic CMOS image sensors are arrayed in a 3DIC package, each of the multiple monochromatic CMOS image sensors tuned to a different component wavelength range of a received image stream.

At block 504, different monochromatic image streams are sensed in parallel at different respective wavelength ranges by the multiple monochromatic CMOS image sensors.

At block 506, the different monochromatic image streams are processed in parallel to reconstruct a full spectrum HD color video stream.

The example method 500 may further include sensing and processing an infrared monochromatic image stream or an ultraviolet monochromatic image stream in parallel with visible monochromatic image streams.

The example method 500 can include sensing the different monochromatic image streams via the multiple monochromatic CMOS image sensors at a low light level or a night vision light level and reconstructing an HD full spectrum color image stream or a 4K HD color video stream from the different monochromatic image streams sensed at the low light level or the night vision light level.

The example method 500 may include integrating the different monochromatic image streams on one interposer chip to increase a speed of the parallel processing and a speed of the reconstruction of the full spectrum image stream.

The example method 500 may also include heterogeneously integrating the different monochromatic image streams into a full-spectrum image stream to achieve an enhanced spatial resolution, a higher sensitivity, an improved low light performance, or an improved color reconstruction.

Figure 6:
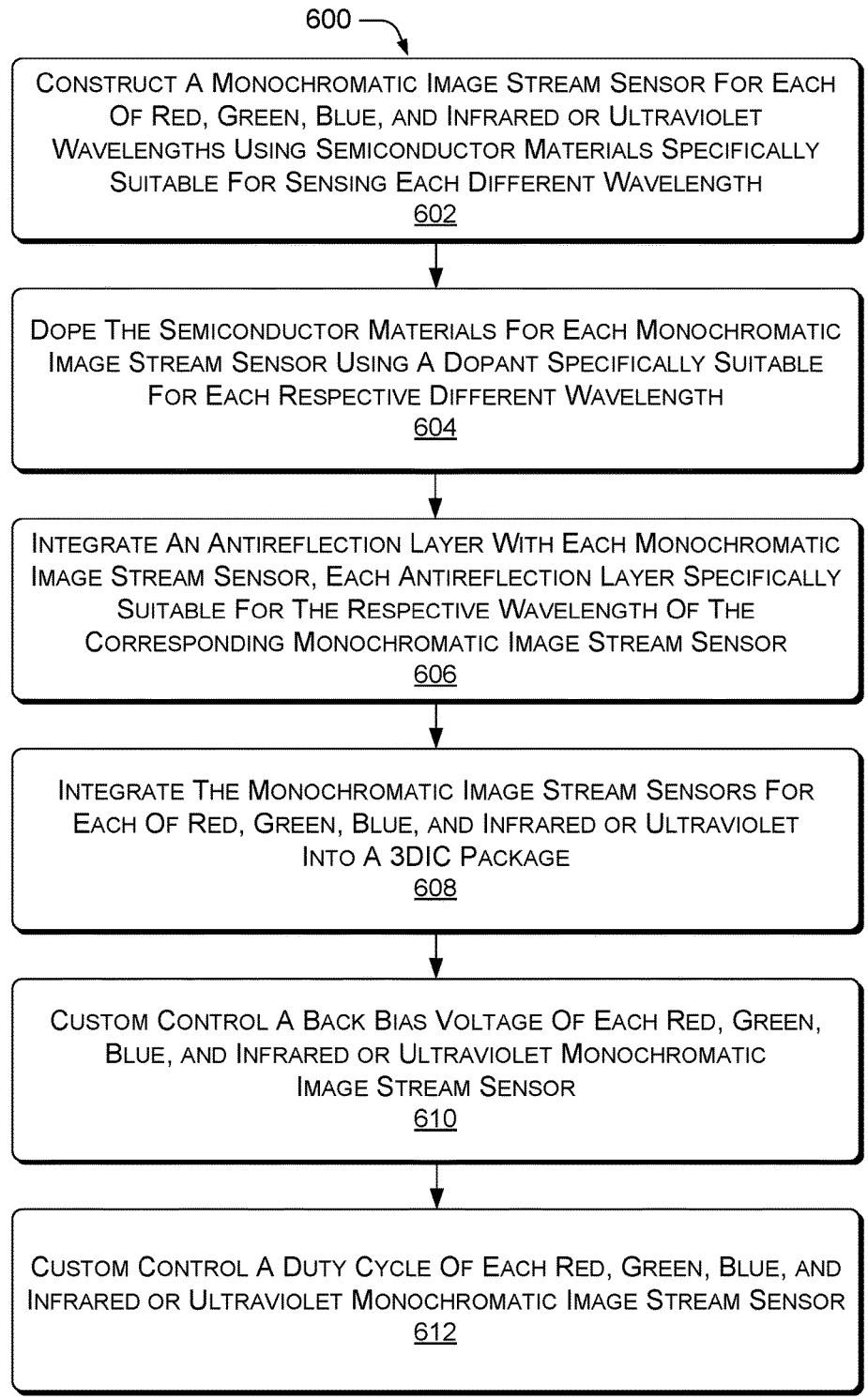
FIG. 6 is a flow diagram of an example method of constructing and controlling monochromatic image stream sensors, each monochromatic image stream sensor constructed and controlled to sense a specific wavelength or color of light.

FIG. 6 shows an example method 600 of constructing and controlling monochromatic image stream sensors, each monochromatic image stream sensor constructed and controlled for a specific wavelength or color of light. In the flow diagram, the operations are shown as individual blocks.

At block 602, a monochromatic image stream sensor is constructed for each of red, green, blue, and infrared (or ultraviolet) wavelengths using semiconductor materials specifically suitable for sensing each different wavelength.

At block 604, the semiconductor material for each monochromatic image stream sensor is doped using a dopant specifically suitable for each respective different wavelength.

At block 606, an antireflection layer is integrated with each monochromatic image stream sensor, each antireflection layer specifically suitable for the respective wavelength of the corresponding monochromatic image stream sensor.

At block 608, the monochromatic image stream sensors for each of red, green, blue, and infrared or ultraviolet are integrated into a 3DIC package.

At block 610, a back bias voltage is custom controlled for each red, green, blue, and infrared or ultraviolet image stream sensor.

At block 612, a duty cycle is custom controlled for each red, green, blue, and infrared or ultraviolet image stream sensor.

The present disclosure has been disclosed with respect to a limited number of embodiments, but those skilled in the art, having the benefit of this disclosure, will appreciate numerous modifications and variations from the description provided herein. It is intended that the appended claims cover such modifications and variations as fall within the true spirit and scope of the disclosure.

The invention claimed is:

1. A 3DIC package for color video, comprising:
    a CMOS image sensor (CIS) wafer;
    an optical splitter to partition received light of an image stream into multiple light outputs, each of the multiple light outputs comprising an instance of the received light;
    multiple separate monochromatic CMOS image sensors formed on the CIS wafer, each of the multiple separate monochromatic CMOS image sensors coupled to one of the multiple light outputs of the optical splitter to sense a monochromatic image stream at a respective component wavelength of the received light;
    a III-V semiconductor material die integrated onto the CIS wafer via chip-to-wafer bonding for infrared imaging in parallel with visible light imaging; and
    an integrator for heterogeneously combining the respective monochromatic image streams from the multiple separate monochromatic CMOS image sensors and the III-V semiconductor material die into a full-spectrum color image stream at a low light level or a night vision light level; wherein the multiple separate monochromatic CMOS image sensors further comprise a first monochromatic CMOS image sensor for sensing a first monochromatic image stream of a red wavelength, a second monochromatic CMOS image sensor for sensing a second monochromatic image stream of a green wavelength, and a third monochromatic CMOS image sensor for sensing a third monochromatic image stream of a blue wavelength.

2. The 3DIC package of claim 1, further comprising a fourth monochromatic CMOS image sensor for sensing a fourth monochromatic image stream of an infrared wavelength or an ultraviolet wavelength.

3. The 3DIC package of claim 1, wherein each of the multiple monochromatic CMOS image sensors comprises a different thickness and a different doping profile tuned to photodetection of a particular component wavelength of the received light at a high resolution and the low light level or the night vision light level.

4. The 3DIC package of claim 1, further comprising an antireflection layer associated with each of the multiple monochromatic CMOS image sensors, each antireflection layer tuned to a particular wavelength range of the associated monochromatic CMOS image sensor.

5. The 3DIC package of claim 1, wherein the integrator comprises one of an interposer for combining the multiple monochromatic image streams or a processor for parallel processing the multiple monochromatic image streams.

6. The 3DIC package of claim 1, wherein the optical splitter is selected from the group consisting of a tree coupler, one or more prisms, and a fiber optic coupler.

7. The 3DIC package of claim 1, further comprising a monochromatic sensor controller, including a back bias voltage controller to apply a different back bias voltage to each of the multiple monochromatic CMOS image sensors to control a depletion width of each individual monochromatic CMOS image sensor for sensing a particular component wavelength of the received light.

8. The 3DIC package of claim 1, further comprising a monochromatic sensor controller, including a duty cycle controller to tune each of the multiple monochromatic CMOS image sensors for a sensitivity to a particular component wavelength of the received light and an improved quantum efficiency at the particular component wavelength of the received light.

9. The 3DIC package of claim 1, wherein at least one of the multiple monochromatic CMOS image sensors comprises a material other than a silicon photodiode material, the material selected from the group consisting of indium gallium arsenide (InGaAs), germanium (Ge), lead sulfide (PbS), lead selenide (Pb Se), photoconductive indium antimonide (InSb), indium arsenide (InAs), Platinum slilcide (PtSi), photodiode-type indium antimonide (InSb), mercury cadmium telluride (MCT, HgCdTe), mercury zinc telluride (MZT, HgZnTe), lithium tantalite (LiTaO$_3$), and triglycine sulfate (TGS and DTGS).

10. The 3DIC package of claim 9, further comprising an up-conversion material for detecting infrared photons or a down-conversion material for detecting ultraviolet photons.

11. The 3DIC package of claim 1, wherein at least one of the multiple monochromatic CMOS image sensors further comprises a quantum dot photodetector (QDP) tuned to a component wavelength of the received light or a quantum dot photosensing material.

12. A method, comprising:
    arraying multiple separate monochromatic CMOS image sensors in a 3DIC package formed on a CMOS image sensor (CIS) wafer, each of the multiple separate monochromatic CMOS image sensors tuned to a different component wavelength range of a received image stream;
    integrating a III-V semiconductor material die onto the CIS wafer via chip-to-wafer bonding;
    sensing different monochromatic image streams at different respective wavelength ranges in parallel; and processing the different monochromatic image streams and the III-V semiconductor material die in parallel to reconstruct a full spectrum image stream at a low light level or a night vision light level; wherein the multiple separate monochromatic CMOS image sensors further comprise a first monochromatic CMOS image sensor for sensing a first monochromatic image stream of a red wavelength, a second monochromatic CMOS image sensor for sensing a second monochromatic image stream of a green wavelength, and a third monochromatic CMOS image sensor for sensing a third monochromatic image stream of a blue wavelength.

13. The method of claim 12, further comprising sensing and processing an infrared monochromatic image stream or an ultraviolet monochromatic image stream in parallel with visible monochromatic image streams.

14. The method of claim 12, further comprising sensing the different monochromatic image streams via the multiple monochromatic CMOS image sensors at the low light level or the night vision light level and reconstructing an HD full spectrum color image stream or a 4K HD color video stream from the different monochromatic image streams sensed at the low light level or the night vision light level.

15. The method of claim 12, further comprising integrating the different monochromatic image streams on one interposer chip to increase a speed of the parallel processing and a speed of the reconstruction of the full spectrum image stream.

16. The method of claim 12, further comprising heterogeneously integrating the different monochromatic image streams into the full: spectrum color image stream to achieve an enhanced spatial resolution, a higher sensitivity, an improved low light performance, or an improved color reconstruction.

17. A method, comprising:
constructing a separate monochromatic image stream sensor for each of red, green, blue, and infrared or ultraviolet wavelengths using a III-V semiconductor material specifically suitable for sensing each different wavelength;
doping the III-V semiconductor material for each separate monochromatic image stream sensor using a dopant specifically suitable for each respective different wavelength;
integrating an antireflection layer with each separate monochromatic image stream sensor, each antireflection layer specifically suitable for the respective wavelength of the corresponding separate monochromatic image stream sensor; and
integrating the separate monochromatic image stream sensors for each of red, green, blue, and infrared or ultraviolet into a 3DIC package; wherein the multiple separate monochromatic CMOS image sensors further comprise a first monochromatic CMOS image sensor for sensing a first monochromatic image stream of a red wavelength, a second monochromatic CMOS image sensor for sensing a second monochromatic image stream of a green wavelength, and a third monochromatic CMOS image sensor for sensing a third monochromatic image stream of a blue wavelength.

18. The method of claim 17, further comprising custom controlling a back bias voltage for each red, green, blue, and infrared or ultraviolet image stream sensor; and
custom controlling a duty cycle for each red, green, blue, and infrared or ultraviolet image stream sensor.

19. The method of claim 12, further comprising integrating an antireflection layer with each of the multiple monochromatic CMOS image sensors, each antireflection layer tuned to a particular wavelength range of the associated monochromatic CMOS image sensor.

\* \* \* \* \*